United States Patent
Hayashi et al.

(10) Patent No.: US 9,059,065 B2
(45) Date of Patent: Jun. 16, 2015

(54) METHOD OF VARYING GAIN OF AMPLIFYING PHOTOELECTRIC CONVERSION DEVICE AND VARIABLE GAIN PHOTOELECTRIC CONVERSION DEVICE

(71) Applicants: National Institute of Advanced Industrial Science and Technology, Tokyo (JP); RICOH COMPANY, LTD., Tokyo (JP)

(72) Inventors: Yutaka Hayashi, Tsukuba (JP); Kazuhiro Yoneda, Osaka (JP); Hirofumi Watanabe, Miki (JP); Katsuhiko Aisu, Takarazuka (JP); Takaaki Negoro, Kishiwada (JP); Toshitaka Ota, Tsukuba (JP); Yasushi Nagamune, Tsukuba (JP)

(73) Assignees: National Institute of Advanced Industrial Science and Technology, Tokyo (JP); RICOH COMPANY, LTD., Tokyo (JP)

( * ) Notice: Subject to any disclaimer, the term of this patent is extended or adjusted under 35 U.S.C. 154(b) by 231 days.

(21) Appl. No.: 13/845,343

(22) Filed: Mar. 18, 2013

(65) Prior Publication Data
US 2013/0240716 A1  Sep. 19, 2013

(30) Foreign Application Priority Data
Mar. 19, 2012 (JP) .................................. 2012-061554

(51) Int. Cl.
*H01L 27/146* (2006.01)
*H04N 5/243* (2006.01)
*H04N 5/3745* (2011.01)

(52) U.S. Cl.
CPC .......... *H01L 27/14681* (2013.01); *H04N 5/243* (2013.01); *H04N 5/3745* (2013.01)

(58) Field of Classification Search
CPC combination set(s) only.
See application file for complete search history.

(56) References Cited

U.S. PATENT DOCUMENTS

| 5,532,471 A | * | 7/1996 | Khorramabadi et al. . 250/214 A |
| 7,157,977 B2 | * | 1/2007 | Lee et al. ...................... 330/308 |
| 2008/0012543 A1 | | 1/2008 | Negoro |
| 2011/0215224 A1 | * | 9/2011 | Kobayashi ................. 250/208.2 |

FOREIGN PATENT DOCUMENTS

| JP | 1-288181 | 11/1989 |
| JP | 2008-21166 | 1/2008 |

* cited by examiner

*Primary Examiner* — Francis M Legasse, Jr.
(74) *Attorney, Agent, or Firm* — Cooper & Dunham LLP (57) ABSTRACT

Provided is a method of varying the gain of an amplifying photoelectric conversion device and a variable gain photoelectric conversion device which are capable of achieving both signal processing under low illuminance and high-current processing under high light intensity, and thereby capable of securing a wide dynamic range. An amplifying photoelectric conversion part includes a photoelectric conversion element and amplification transistors forming a Darlington circuit. The sources and the drains of field-effect transistors are connected to the bases and the emitters of the amplification transistors, respectively. The gates of the field-effect transistors each function as a gain control part.

14 Claims, 3 Drawing Sheets

METHOD OF VARYING GAIN OF AMPLIFYING PHOTOELECTRIC CONVERSION DEVICE AND VARIABLE GAIN PHOTOELECTRIC CONVERSION DEVICE

CROSS-REFERENCE TO RELATED APPLICATIONS

The present application is based on and claims priority from Japanese Patent Application Number 2012-61554, filed Mar. 19, 2012, the disclosure of which is hereby incorporated by reference herein in its entirety.

BACKGROUND

The present invention relates to: a method of varying the gain of an amplifying photoelectric conversion device and an amplifying photoelectric conversion cell which convert light input information into an electric signal; a variable gain photoelectric conversion device; a variable gain photoelectric conversion cell; and the like.

Photoelectric conversion cells using phototransistors are used as a photoelectric conversion device, photoelectric conversion cell, and photoelectric conversion array which amplify and extract a photoelectric current. Moreover, there have been known a one-dimensional array formed of Darlington photoelectric conversion cells in each of which multiple amplifying transistors are connected so as to increase sensitivity under low illuminance, as well as a two-dimensional photo-sensor array having multiple transistor structures (e.g. Patent Application Publication No. H01-288181, etc.).

SUMMARY

As the gain (amplification factor) of a photoelectric current in such a photoelectric conversion device, cell, or array increases, electrical output (e.g. output current, etc.) under low illuminance increases, thereby making signal processing easier. Although this brings about the advantage that good sensitivity is obtained under low illuminance, the following problem arises as well. Specifically, because the electrical output increases as the illuminance increases, the resistances of pixel-address select transistors in the photoelectric conversion array may become problematic, making the photoelectric current unproportional to the light intensity and thereby making accurate signal reading difficult. The light intensity actually shows about a six-digit change when the environment changes from under starlight to under clear sky in midsummer. Thus, the conventional techniques cannot achieve both increase in the gain and increase in the detectable dynamic range of light intensity. For this reason, it has been an issue to accurately adjust the amplification factor in proportion to the incident light intensity.

Moreover, when the amplification factors are low, the sensitivity control is easy but amplification transistors are required to be connected in a multi-stage configuration. This causes a problem of increasing the size of the photoelectric conversion device. On the other hand, when the amplification factors of the amplification transistors are high, the sensitivity adjustment is rough, thereby causing a problem of making the sensitivity control difficult.

Furthermore, scientific experiments, special imaging, and the like require partial brightness correction of an image. According to conventional techniques, partial brightness correction of an image has been done by means of software processing. However, if the imaging array cannot provide the partial-brightness-corrected signal output in real-time, the software processing cannot avoid a delay for the amount of time taken for its information processing. In addition, because the dynamic range of the imaging array is limited, the obtainable amount of information is limited.

An object of the present invention is to provide a method of varying the gain of an amplifying photoelectric conversion device and a variable gain photoelectric conversion device which are capable of achieving both signal processing to attain high sensitivity under low illuminance and high-current processing under high light intensity, and thereby capable of securing a wide dynamic range.

In the present invention, light input information such as the light intensity, light wavelength, or light modulation frequency is converted into an electric variable by a photoelectric conversion element and supplied to an amplification part.

The photoelectric conversion element is a photodiode or the like whose current value and voltage value are varied or modulated according to the light intensity, light wavelength, or light modulation frequency.

Moreover, the electric variable refers to an amount in an electrical unit such as current, voltage, accumulated charge, or frequency.

In the present invention, a photoelectric conversion element comprising a photodiode or a phototransistor and one or more transistors are used. Said one or more transistors are used as an elements for the amplification of output of said photoelectric conversion element.

In the present invention, the electric variable obtained by the conversion is amplified or converted and amplified by the amplification part and outputted as an electric signal. The present invention relates to: a method of varying the gain of an amplifying photoelectric conversion device and an amplifying photoelectric conversion cell having such an amplification part; and the like.

The specification of the present application will show an example where a current being an electric variable is amplified and outputted as an electric signal (as a current or accumulated charges) and an example where charges being an electric variable or voltage variation resulting therefrom are or is converted, amplified, and outputted as an electric signal (as a current or charges).

Hereinbelow, methods for varying gain, variable gain photoelectric conversion devices, and variable gain photoelectric conversion cells provided by the present invention will be described in detail.

(1) A method of varying gain of an amplifying photoelectric conversion device which includes: an amplifying photoelectric conversion part including a photoelectric conversion element and multiple transistors each having a collector, a base, and an emitter; and multiple first field-effect transistors each having a source, a drain, and a gate, and in which the sources and the drains of the first field-effect transistors are connected respectively between the emitters and the bases of the transistors, the photoelectric conversion element is connected to the base of a transistor selected from the multiple transistors, the photoelectric conversion element is a device which performs photoelectric conversion of light input information being light intensity or light wavelength into an electric variable being electric current, electric charge, or voltage, at least one of the collectors of the multiple transistors is a first output part, one of the emitters of the multiple transistors is a second output part, the emitters of the multiple transistors other than the second output part are connected respectively to the bases of the other transistors further excluding the selected transistor, to the base of which the photoelectric conversion element is connected, and the electric variable resulting from the photoelectric conversion is an electric signal in the form of an amplified current, charge, or voltage obtained from the first output part or the second output part, the method including the step of applying gain control potentials to the gates to vary gain of the electric signal obtained from the first output part or the second output part.

Here, the gain is defined as the ratio of the output at the first output part or at the second output part of the amplifying photoelectric conversion part to output of the amplifying photoelectric conversion part.

(2) A variable gain photoelectric conversion device including:
an amplifying photoelectric conversion device including:
an amplifying photoelectric conversion part including a photoelectric conversion element and multiple transistors each having a collector, a base, and an emitter; and
multiple first field-effect transistors each having a source, a drain, and a gate, in which
the sources and the drains of the first field-effect transistors are connected respectively between the emitters and the bases of the transistors,
the photoelectric conversion element is connected to the base of a transistor selected from the multiple transistors,
the photoelectric conversion element is a device which performs photoelectric conversion of light input information being light intensity or light wavelength into an electric variable being electric current, electric charge, or voltage,
at least one of the collectors of the multiple transistors is a first output part,
one of the emitters of the multiple transistors is a second output part,
the emitters of the multiple transistors other than the second output part are connected respectively to the bases of the other transistors further excluding the selected transistor, to the base of which the photoelectric conversion element is connected, and
the electric variable resulting from the photoelectric conversion is an electric signal in the form of an amplified current, charge, or voltage obtained from the first output part or the second output part, in which
gain control potentials are applied to the gates to vary gain of the electric signal obtained from the first output part or the second output part.

(3) The variable gain photoelectric conversion device according to (2) in which the photoelectric conversion element is a photodiode.

(4) The variable gain photoelectric conversion device according to (2), in which the photoelectric conversion element is a photodiode including the collector and the base of the selected transistor.

For the photodiodes being the photoelectric conversion element described above, it is possible to use one with a structure which involves introduction of light onto a rectifying junction of germanium, GaSb, or InSb provided on the same substrate as that of the transistor, with an insulating film therebetween if necessary, or onto the collector-base junction of the transistor.

Now, suppose that input light has a spectral distribution and that the photoelectric conversion element has spectral distribution characteristics. Here, there may be light rays that have the same light intensity yet different electric variables after they are subjected to photoelectric conversion. Then, it is possible to convert wavelength information on light into an electric variable. Moreover, if the intensity or wavelength of input light is modulated at a given frequency, a signal at the modulation frequency can be found also in the electric variable obtained by the photoelectric conversion and in the electric signal to be outputted.

(5) The method of varying gain of an amplifying photoelectric conversion device, in which in the above-described amplifying photoelectric conversion device, the multiple transistors have different amplification factors, and
a gain control potential is applied to a given one or more of the gates to vary the gain of the electric signal obtained from the first output part or the second output part.

(6) A variable gain photoelectric conversion device, in which in the above-described variable gain photoelectric conversion device, the amplification transistors have amplification factors which are at least two times different from each other, and
a gain control potential is applied to a given one or more of the gates to vary the gain of the electric signal obtained from the first output part or the second output part.

(7) A variable gain photoelectric conversion device including:
an amplifying photoelectric conversion part having multiple bases provided respectively for collectors continuous with or connected to each other and multiple emitters provided respectively for the multiple bases; and
multiple first field-effect transistors each having a source, a drain, and a gate, in which
the collectors are a first output part,
one of the multiple emitters is a second output part,
one of the multiple bases and the collectors perform photoelectric conversion of light input information being light intensity or light wavelength into an electric variable being electric current, electric charge, or voltage,
the multiple bases other than the base involved in the photoelectric conversion are respectively connected to the multiple emitters other than the emitter serving as the second output part,
the electric variable resulting from the photoelectric conversion is an electric signal in the form of an amplified current, charge, or voltage obtained from the first output part or the second output part,
either of the sources and the drains are connected to either of the bases and the emitters, respectively,
the other of the sources and the drains are connected to the other of the bases and the emitters, respectively, and
gain control potentials are applied to the gates to vary gain of the electric signal obtained from the first output part or the second output part.

(8) A variable gain photoelectric conversion cell including:
the variable gain photoelectric conversion device according to (2); and
a second field-effect transistor having a source, a drain, and a gate, in addition to the first field-effect transistors used for varying the gain, in which
the second output part is connected to one of the source and the drain of the second field-effect transistor,
the other of the source and the drain of the second field-effect transistor is a cell output part,
the gate of the second field-effect transistor is a cell select part, and
the variable gain photoelectric conversion cell is selected by shifting a potential applied to the cell select part from a first select potential at which the second field-effect transistor is shut off to a second select potential at which the second field-effect transistor is conductive.

(9) A variable gain photoelectric conversion cell including:
the variable gain photoelectric conversion device according to (2), in which gain adjustment is performed by monitoring the electric signal outputted from the first output part or the second output part and by controlling voltages to be applied to the gates on the basis of a result of the monitoring.
(10) The variable gain photoelectric conversion cell according to (8), in which gain adjustment is performed by monitoring the electric signal outputted from the first output part or the second output part and by controlling voltages to be applied to the gates on the basis of a result of the monitoring.
(11) The variable gain photoelectric conversion cell according to (9), in which the gain adjustment is performed by comparing the electric signal outputted from the first output part or the second output part with a reference electric signal (for example, reference voltage), converting a difference therebetween into a digital signal, and supplying gain control potentials at levels which eliminate the difference.
(12) The variable gain photoelectric conversion cell according to (10), in which the gain adjustment is performed by comparing the electric signal outputted from the first output part or the second output part with a reference electric signal (for example, reference voltage), converting a difference therebetween into a digital signal, and supplying gain control potentials at levels which eliminate the difference.
(13) The variable gain photoelectric conversion cell according to (9), in which the gain adjustment is performed by inputting the electric signal outputted from the first output part or the second output part into multiple comparators and supplying outputs of the comparators to the gates as gain control potentials.
(14) The variable gain photoelectric conversion cell according to (10), in which the gain adjustment is performed by inputting the electric signal outputted from the first output part or the second output part into multiple comparators and supplying outputs of the comparators to the gates as gain control potentials.

According to the present invention, it is possible to achieve both signal processing under low illuminance and high-current processing under high light intensity, and thereby to secure a wide dynamic range. Further, by providing the multiple amplification transistors whose bases and emitters are connected to the sources and drains or the drains and sources of the multiple field-effect transistors, the pitch of the variable gains can be finer than otherwise, thereby allowing finer image adjustment. Ultimately, the finest gain variations can be achieved by a configuration where the sources or the drains are all connected to the bases or the emitters of all the amplification transistors.

DETAILED DESCRIPTION OF THE PREFERRED EMBODIMENTS

Figure 1:
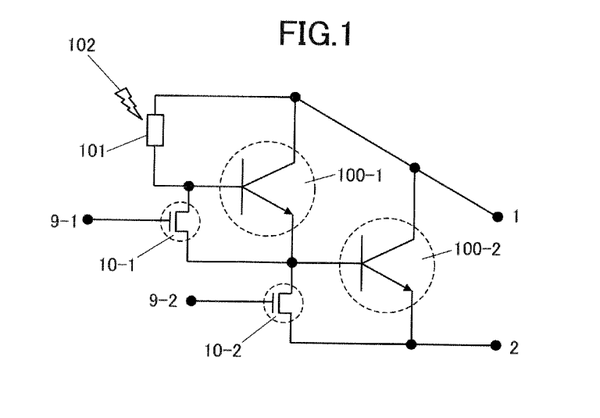
FIG. 1 is a circuit diagram of an embodiment of the method of varying gain and the variable gain photoelectric conversion device according to (1).

FIG. 1 is a circuit diagram showing an embodiment of the variable gain photoelectric conversion device according to (2) of the present invention.

FIG. 1 illustrates a case of using two amplification transistors 100-1 and 100-2. One end of a photoelectric conversion element 101 such as a photodiode or a phototransistor is connected to the base of the amplification transistor 100-1. Note that reference numeral 102 in FIG. 1 schematically represents input light (the same applies to subsequent drawings). The other end of the photoelectric conversion element 101 may be connected independently to a constant potential but, in the case of FIG. 1, is connected to the collectors of the two transistors 100-1 and 100-2 through connecting means. The collectors of the two transistors function as an output part 1 of the variable gain photoelectric conversion device of the present invention.

In this circuit, the emitter of the amplification transistor 100-1 is connected to the base of the amplification transistor 100-2, thereby forming a two-stage Darlington circuit. Moreover, the amplification transistors 100-1 and 100-2 form the amplification part of the variable gain photoelectric conversion device. This amplification part and the aforementioned photoelectric conversion element connected thereto will be collectively referred to as an amplifying photoelectric conversion part.

Moreover, the source of a first field-effect transistor 10-1 is connected to the base of the amplification transistor 100-1, and the drain of the first field-effect transistor 10-1 is connected to the emitter of the amplification transistor 100-1. Further, the source of a first field-effect transistor 10-2 is connected to the emitter of the amplification transistor 100-1, and the drain of the first field-effect transistor 10-2 is connected to the emitter of the amplification transistor 100-2. The gates of the first field-effect transistors 10-1 and 10-2 function as gain control parts 9-1 and 9-2, respectively. The emitter of the amplification transistor 100-2 functions as an output part 2.

The method of varying gain according to (1) above will be described with reference to the specific example shown in FIG. 1.

A photoelectric current flowing in the photoelectric conversion element 101, a current flowing as a result of charging and discharging of charges which are discharged and accumulated by the photoelectric conversion element 101 at the time of readout, or a voltage generated in the photoelectric conversion element 101 is amplified by the amplification transistors 100-1 and 100-2 and flows in and out of the output part 1 or the output part 2. This signal current or signal charges flowing in and out increases and decreases according to the potentials of the gain control parts 9-1 and 9-2. In this specification, such a signal current and signal charges will be collectively referred to as an electric signal.

When the potential of the gain control part 9-1 (gain control potential) is varied to a level at which a channel is created in the first field-effect transistor 10-1 (a level at which the first field-effect transistor 10-1 is turned on), a current path is formed which bypasses the path between the base and the emitter of the corresponding amplification transistor 100-1. As a result, the current that is supposed to flow between the base and the emitter for amplification flows through the bypass path, thereby reducing the amplification factor (gain) of the amplification transistor 100-1 having the first field-effect transistor 10-1 connected between its base and emitter. In other words, the potential of the gain control part 9-1 makes the gain of the amplification transistor 100-1 variable.

Moreover, when the potential of the gain control part 9-2 is varied to a level at which a channel is created in the first field-effect transistor 10-2, a current path is formed which bypasses the path between the base and the emitter of the corresponding amplification transistor 100-2. As a result, the current that is supposed to flow between the base and the emitter for amplification flows through the bypass path, thereby reducing the amplification factor (gain) of the amplification transistor 100-2 as in the above case. In other words, the potential of the gain control part 9-2 makes the gain of the amplification transistor 100-2 variable.

When the whole configuration of FIG. 1 is seen as a photoelectric conversion device, the amplification factor (gain) of the signal current or signal charges, i.e. electric signal, to be inputted to and outputted from the output part 1 or the output part 2 in response to light input information of the input light 102 varies according to the potentials of the gain control parts 9-1 and 9-2. In other words, a variable gain photoelectric conversion device is obtained.

Note that in the present invention, some transistors are described as "amplification transistors" when the amplifying operations of the transistors need to be emphasized. However, transistors are often described simply as "transistors" when they reappear in the specification or when simple description is preferred.

Here, when transistors are described simply as "transistors," these transistors are often bipolar transistors.

Figure 2:
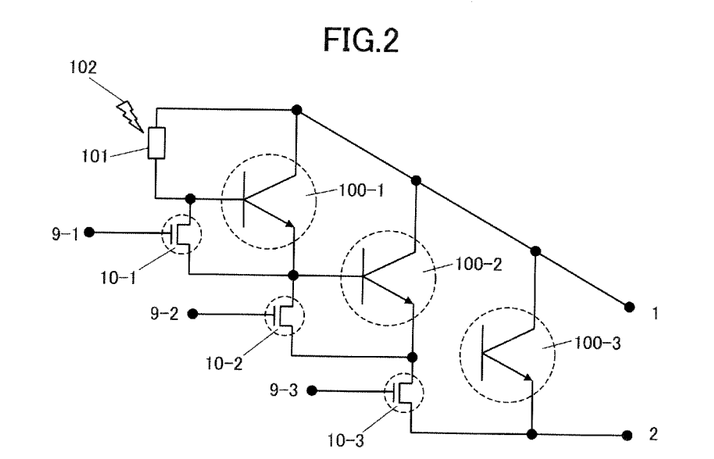
FIG. 2 is a circuit diagram of another embodiment of the method of varying gain and the variable gain photoelectric conversion device according to (2).

FIG. 2 is a circuit diagram showing another embodiment of the variable gain photoelectric conversion device according to (2) of the present invention. FIG. 2 illustrates a case of using three amplification transistors 100-1, 100-2, and 100-3 and three field-effect transistors 10-1, 10-2, and 10-3 (first field-effect transistors). One end of a photoelectric conversion element 101 such as a photodiode or a phototransistor is connected to the base of the amplification transistor 100-1. The other end of the photoelectric conversion element 101 may be connected independently to a constant potential but, in this case, is connected to the collectors of the three transistors 100-1, 100-2, and 100-3 through connecting means. The collectors of the three transistors function as an output part 1 of the variable gain photoelectric conversion device of the present invention.

In this circuit, the three amplification transistors 100-1, 100-2, and 100-3 form a three-stage Darlington circuit and form the amplification part of the variable gain photoelectric conversion device. This amplification part and the aforementioned photoelectric conversion element connected thereto will be collectively referred to as an amplifying photoelectric conversion part.

Moreover, the source of the first field-effect transistor 10-1 is connected to the one end of the photoelectric conversion element 101, and the drain of the first field-effect transistor 10-1 is connected to the emitter of the amplification transistor 100-1. Further, the source of the first field-effect transistor 10-2 is connected to the emitter of the amplification transistor 100-1, and the drain of the first field-effect transistor 10-2 is connected to the emitter of the amplification transistor 100-2. Furthermore, the source of the first field-effect transistor 10-3 is connected to the emitter of the amplification transistor 100-2, and the drain of the first field-effect transistor 10-3 is connected to the emitter of the amplification transistor 100-3. The gates of the first field-effect transistors 10-1, 10-2, and 10-3 function as gain control parts 9-1, 9-2, and 9-3, respectively. The emitter of the amplification transistor 100-3 functions as an output part 2.

The method of varying gain according to (1) above will be described with reference to the specific example shown in FIG. 2. When the potential of the gain control part 9-1 (gain control potential) is varied to a level at which a channel is created in the first field-effect transistor 10-1, a current path is formed which bypasses the path between the base and the emitter of the corresponding amplification transistor 100-1. As a result, the current that is supposed to flow between the base and the emitter for amplification flows through the bypass path, thereby reducing the amplification factor (gain) of the amplification transistor 100-1 as in the case above.

Moreover, when the potential of the gain control part 9-2 is varied to a level at which a channel is created in the first field-effect transistor 10-2, a current path is formed which bypasses the path between the base and the emitter of the corresponding amplification transistor 100-2. As a result, the current that is supposed to flow between the base and the emitter for amplification flows through the bypass path, thereby reducing the amplification factor (gain) of the amplification transistor 100-2 as in the above case.

Moreover, when the potential of the gain control part 9-3 is varied to a level at which a channel is created in the first field-effect transistor 10-3, a current path is formed which bypasses the path between the base and the emitter of the corresponding amplification transistor 100-3. As a result, the current that is supposed to flow between the base and the emitter for amplification flows through the bypass path, thereby reducing the amplification factor (gain) of the amplification transistor 100-3 as in the above case.

When the whole configuration of FIG. 2 is seen as a photoelectric conversion device, the amplification factor (gain) of the signal current or signal charges, i.e. electric signal, to be inputted to and outputted from the output part 1 or the output part 2 in response to light input information of input light 102 varies according to the potentials of the gain control parts 9-1, 9-2, and 9-3. In other words, a variable gain photoelectric conversion device is obtained.

As described above, the amplification transistors and the gain-control field-effect transistors are in pairs. Thus, selecting a gain control part results in the bypassing of an amplification transistor and thereby eliminates its amplification operation. Hence, by selecting a given gain control part, the corresponding amplification transistor is bypassed. Meanwhile, to increase accuracy, it is desirable to shield the amplification transistors and the variable gain field-effect transistors from light so that they can avoid influence of light.

Figure 3:
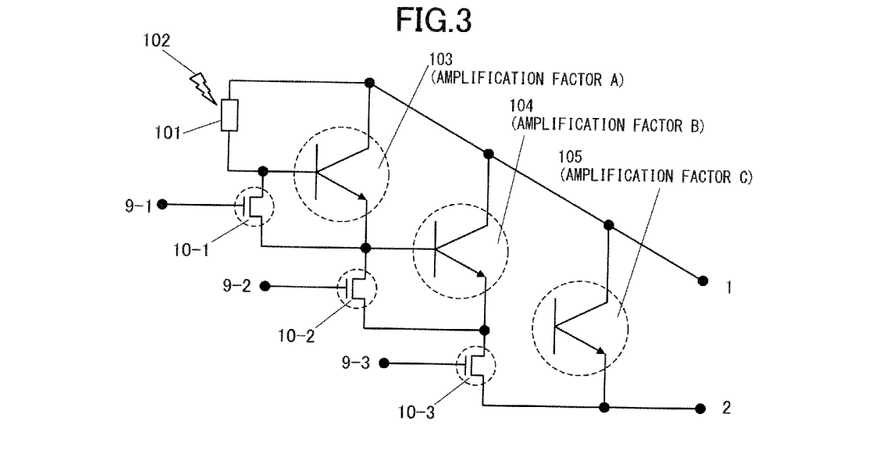
FIG. 3 is a circuit diagram of an embodiment of the method of varying gain and the variable gain photoelectric conversion device according to (6).

FIG. 3 is a circuit diagram showing an embodiment of the variable gain photoelectric conversion device according to (6) of the present invention.

While FIGS. 1 and 2 illustrate cases where the transistors have the same amplification factor, FIG. 3 illustrates a case of using amplification transistors 103, 104, and 105 having different amplification factors and three field-effect transistors 10-1, 10-2, and 10-3 (first field-effect transistors). One end of a photoelectric conversion element 101 such as a photodiode or a phototransistor is connected to the base of the amplification transistor 103. The other end of the photoelectric conversion element 101 may be connected independently to a constant potential but, in this case, is connected to the collectors of the three transistors 103, 104, and 105 through connecting means. The collectors of the three transistors function as an output part 1 of the variable gain photoelectric conversion device of the present invention.

In this circuit, the three amplification transistors 103, 104, and 105 form a three-stage Darlington circuit and form the amplification part of the variable gain photoelectric conversion device. This amplification part and the aforementioned photoelectric conversion element connected thereto will be collectively referred to as an amplifying photoelectric conversion part.

Moreover, the source of the first field-effect transistor 10-1 is connected to the one end of the photoelectric conversion element 101, and the drain of the first field-effect transistor 10-1 is connected to the emitter of the amplification transistor 103. Further, the source of the first field-effect transistor 10-2 is connected to the emitter of the amplification transistor 103, and the drain of the first field-effect transistor 10-2 is connected to the emitter of the amplification transistor 104. Furthermore, the source of the first field-effect transistor 10-3 is connected to the emitter of the amplification transistor 104, and the drain of the first field-effect transistor 10-3 is connected to the emitter of the amplification transistor 105. The gates of the first field-effect transistors 10-1, 10-2, and 10-3 function as gain control parts 9-1, 9-2, and 9-3, respectively. The emitter of the amplification transistor 105 functions as an output part 2.

The method of varying gain according to (6) above will be described with reference to the specific example shown in FIG. 3. When the potential of the gain control part 9-1 (gain control potential) is varied to a level at which a channel is created in the first field-effect transistor 10-1, a current path is formed which bypasses the path between the base and the emitter of the corresponding amplification transistor 103. As a result, the current that is supposed to flow between the base and the emitter for amplification flows through the bypass path, thereby reducing the amplification factor (gain) of the amplification transistor 103 as in the case above.

Moreover, when the potential of the gain control part 9-2 is varied to a level at which a channel is created in the first field-effect transistor 10-2, a current path is formed which bypasses the path between the base and the emitter of the corresponding amplification transistor 104. As a result, the current that is supposed to flow between the base and the emitter for amplification flows through the bypass path, thereby reducing the amplification factor (gain) of the amplification transistor 104 as in the above case.

Moreover, when the potential of the gain control part 9-3 is varied to a level at which a channel is created in the first field-effect transistor 10-3, a current path is formed which bypasses the path between the base and the emitter of the corresponding amplification transistor 105. As a result, the current that is supposed to flow between the base and the emitter for amplification flows through the bypass path, thereby reducing the amplification factor (gain) of the amplification transistor 105 as in the above case.

When the whole configuration of FIG. 3 is seen as a photoelectric conversion device, the amplification factor (gain) of the signal current or signal charges, i.e. electric signal, to be inputted to and outputted from the output part 1 or the output part 2 in response to light input information of input light 102 varies according to the potentials of the gain control parts 9-1, 9-2, and 9-3. In addition, since the circuit is formed by the transistors having different amplification factors, the gain to be varied differs from one case to another depending upon which gain control part's potential is varied. Thus, obtained is a variable gain photoelectric conversion device capable of finer gain adjustment as a whole.

In general, bipolar transistors as amplification transistors can, due to the way they are manufactured, have variable current amplification factors by adjustment of the concentration of the base impurities which is achieved by varying the amount of the base impurities to be implanted. In this way, it is possible to manufacture transistors with current amplification factors ranging from about 10 to 1000. Here, in the case of a configuration where the transistors have the same amplification factor and that amplification factor is 10, 6 stages of transistors are required in order to achieve a 6-digit amplification factor. This increases the area of the photoelectric conversion device. Moreover, in the case of selecting transistors with an amplification factor as large as 100 for the purpose of avoiding increase in area, only three stages are required. This, however, leads to a rough change in amplification factor at the time of varying the gain and thus makes the gain adjustment difficult. In contrast, in the present invention, amplification transistors with amplification factors of 10, 100, and 1000, respectively, are prepared; thus, the 3 stages of transistors can offer a 6-digit amplification factor by appropriately selecting the field-effect transistors. Accordingly, fine amplification factor adjustment can be done without increasing the area.

Figure 4:
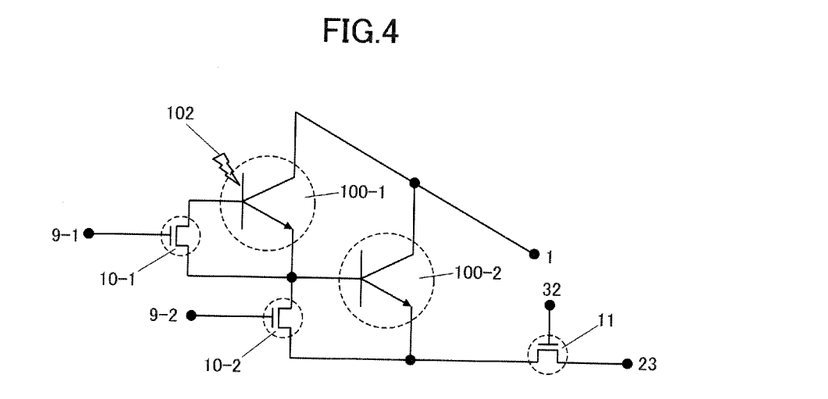
FIG. 4 is a circuit diagram of an embodiment of the variable gain photoelectric conversion cell according to (8).

FIG. 4 is a circuit diagram showing an embodiment of the variable gain photoelectric conversion cell according to (8) of the present invention. In FIG. 4, the base and the collector of a transistor 100-1 function as a photoelectric conversion element as in the case of FIG. 3, and therefore a photoelectric conversion element 101 is not shown.

FIG. 4 illustrates a case of using two amplification transistors 100-1 and 100-2 and three field-effect transistors 10-1, 10-2 (first field-effect transistors), and 11 (second field-effect transistor). Note that the second field-effect transistor 11 operates as a cell select transistor.

A photoelectric current resulting from light input 102 or a charge or discharge current of charges discharged or accumulated due to the photoelectric current is amplified and read out at the emitter or collector of the amplification transistor 100-1. The base of the amplification transistor 100-1 is shared with the photoelectric conversion element (not shown), and the other base and emitter are not connected thereto. The collectors of the two transistors 100-1 and 100-2 have a common connection and function as an output part 1 of the variable gain photoelectric conversion device or cell of the present invention.

In this circuit, the two amplification transistors 100-1 and 100-2 form a two-stage Darlington circuit and form the amplification part of the variable gain photoelectric conversion device or cell, as in FIG. 1.

This amplification part and the base and collector of the amplification transistor 100-1 used as a photoelectric conversion element will be collectively referred to as an amplifying photoelectric conversion part.

Moreover, the source of the first field-effect transistor 10-1 is connected to the base of the amplification transistor 100-1, and the drain of the first field-effect transistor 10-1 is connected to the emitter of the amplification transistor 100-1. Further, the source of the first field-effect transistor 10-2 is connected to the emitter of the amplification transistor 100-1, and the drain of the first field-effect transistor 10-2 is connected to the emitter of the amplification transistor 100-2. The gates of the first field-effect transistors 10-1 and 10-2 function as gain control parts 9-1 and 9-2, respectively. The emitter of the amplification transistor 100-2 is connected to one of the source and the drain of the second field-effect transistor 11. The other of the source and the drain of the second field-effect transistor 11 functions as an output part 23 similarly to the output part 2 in each of FIGS. 1 to 3. The gate of the second field-effect transistor 11 functions as a cell select part 32.

Next, as for operations, when the second field-effect transistor 11 is turned on, a photoelectric current flowing through the base-collector junction of the transistor 100-1, functioning as a photoelectric conversion element, is amplified by the amplification transistors 100-1 and 100-2 and flows in and out of the output part 1 or the output part 23 as a signal current or signal charges. In another case, a current that flows to compensate, at the time of readout, charges equal to the amount of the accumulated charges in the base-collector junction (a junction capacitance or a capacitor connected in parallel to the junction) discharged due to the photoelectric current, is amplified by the amplification transistors 100-1 and 100-2 and flows in and out of the output part 1 or the output part 23 as a signal current or signal charges. The level of the electric signal increases and decreases according to the potentials of the gain control parts 9-1 and 9-2.

When the potential of the gain control part 9-1 (gain control potential) is varied to a level at which a channel is created in the first field-effect transistor 10-1, a current path is formed which bypasses the path between the base and the emitter of the corresponding amplification transistor 100-1. As a result, the current that is supposed to flow between the base and the emitter for amplification flows through the bypass path, thereby reducing the amplification factor (gain) of the amplification transistor 100-1 as in the case above.

Moreover, when the potential of the gain control part 9-2 is varied to a level at which a channel is created in the first field-effect transistor 10-2, a current path is formed which bypasses the path between the base and the emitter of the corresponding amplification transistor 100-2. As a result, the current that is supposed to flow between the base and the emitter for amplification flows through the bypass path, thereby reducing the amplification factor (gain) of the amplification transistor 100-2 as in the above case.

When the whole configuration of FIG. 4 is seen as a photoelectric conversion device, the amplification factor (gain) of a signal current or signal charges, i.e. electric signal, to be inputted to and outputted from the output part 1 or the output part 23 in response to light input information of the input light 102 varies according to the potentials of the gain control parts 9-1 and 9-2. In other words, a variable gain photoelectric conversion device or cell is obtained.

Moreover, in the configuration of FIG. 4, the second field-effect transistor 11 functions as a cell select device. Although this increases the cell area, it is not necessary to separate the collectors of transistors from one row to another or from one column to another in the case of forming an array. Accordingly, high compatibility with MOSLSI manufacturing processes is achieved.

Figure 5:
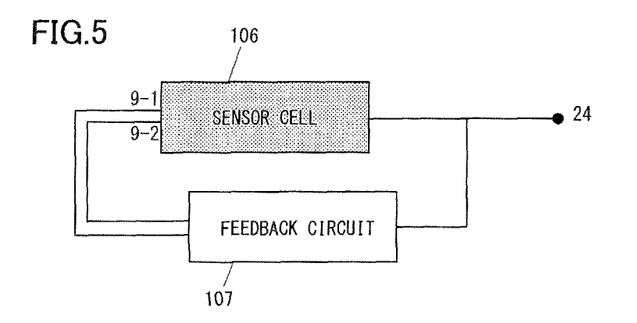
FIG. 5 is a block diagram of an embodiment of the variable gain photoelectric conversion cell according to (9) or (10).

FIG. 5 is a block diagram showing an embodiment of the variable gain photoelectric conversion cell according to (9) or (10) of the present invention. The above variable gain photoelectric conversion device or cell is presented as a sensor cell 106 in the block diagram.

This block diagram is formed of the sensor cell 106 and a feedback circuit 107 and illustrates a block diagram of a sensor cell including two gain control parts 9-1 and 9-2 therein, as in FIG. 1, and a feedback circuit therefor. The feedback circuit includes one or more amplifiers therein, and outputs voltages for controlling the gate control parts 9-1 and 9-2 of the field-effect transistors inside the sensor cell, by comparing a sensor-cell output 24 with a given voltage.

The amplification factor (gain) of the electric signal to be outputted from the sensor cell varies according to the potentials of the gain control parts 9-1 and 9-2. Thus, by controlling the sensor-cell output with the feedback circuit as a whole, it is possible to obtain a variable gain photoelectric conversion cell capable of gain adjustment.

Figure 6:
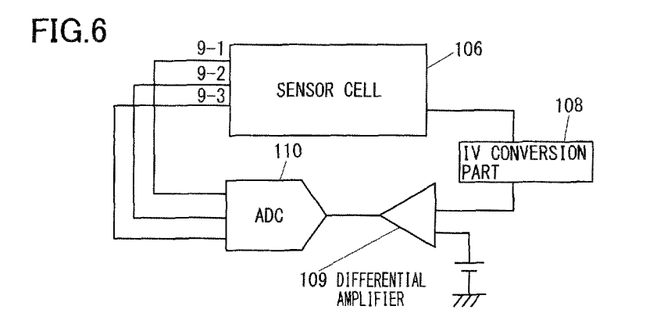
FIG. 6 is a block diagram showing an embodiment of the variable gain photoelectric conversion cell according to (11) or (12).

FIG. 6 is a block diagram showing an embodiment of the variable gain photoelectric conversion cell according to (11) or (12) of the present invention. The above variable gain photoelectric conversion device or cell is presented as a sensor cell 106 in the block diagram.

This block diagram is formed of the sensor cell 106, an IV conversion part 108, a differential amplifier 109, and an AD converter (ADC) 110 and illustrates a configuration where the sensor cell includes three gain control parts 9-1, 9-2, and 9-3.

In this circuit, the output current of the sensor cell is converted to a voltage by the IV conversion part 108, and that output voltage is compared with a reference voltage by the differential amplifier 109. The difference is inputted to the AD converter 110. This AD converter has a data table like Table 1, for example, and outputs given digital signals to the gain control parts 9-1, 9-2, and 9-3 in accordance with the output of the differential amplifier inputted thereto. The data table is so designed as to output digital signals that lower the gain in a case where the output voltage of the sensor cell exceeds a desired voltage range and to output digital signals that increase the gain in a case where the output voltage falls below the desired voltage range.

TABLE 1

| 107 OUTPUT | 9-1 | 9-2 | 9-3 |
|---|---|---|---|
| EQUAL TO OR MORE THAN 4.0 V | 0 | 0 | 0 |
| 3.5-4.0 V | 0 | 0 | 1 |
| 3.0-3.5 V | 0 | 1 | 0 |
| 2.5-3.0 V | 0 | 1 | 1 |
| 2.0-2.5 V | 1 | 0 | 0 |
| 1.5-2.0 V | 1 | 0 | 1 |
| 1.0-1.5 V | 1 | 1 | 0 |
| LESS THAN 1.0 V | 1 | 1 | 1 |

1: HI
0: LO

The amplification factor (gain) of the electric signal to be outputted from the sensor cell varies according to the potentials of the gain control parts 9-1, 9-2, and 9-3. Thus, by controlling the sensor-cell output with the above-described circuit as a whole, it is possible to obtain a variable gain photoelectric conversion cell capable of gain adjustment.

Figure 7:
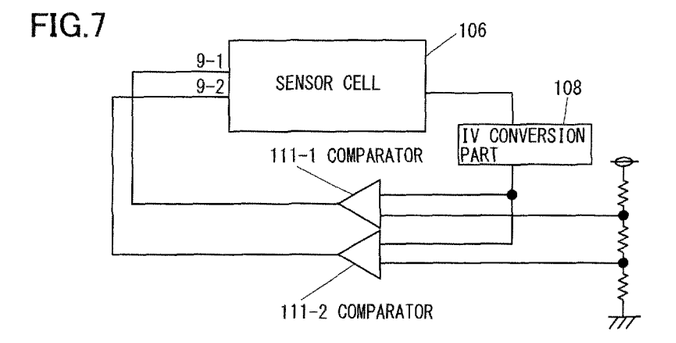
FIG. 7 is a block diagram showing an embodiment of the variable gain photoelectric conversion cell according to (13) or (14).

FIG. 7 is a block diagram showing an embodiment of the variable gain photoelectric conversion cell according to (13) or (14) of the present invention. The above variable gain photoelectric conversion device or cell is presented as a sensor cell 106 in the block diagram.

This block diagram is formed of the sensor cell 106, an IV conversion part 108, and comparators 111-1 and 111-2 and illustrates a configuration where the sensor cell includes two gain control parts 9-1 and 9-2.

In this circuit, the output current of the sensor cell is converted to a voltage by the IV conversion part 108, and that output voltage is inputted to each of the comparators 111-1 and 111-2 which have different reference voltages. The outputs of the comparators are given to the gain control parts 9-1 and 9-2, respectively. The reference voltages are set at the upper and lower limits of a desired voltage range, respectively. The gain is varied in response to the comparators outputting signals that lower the gain in the case where the input into the comparators exceeds the upper limit and outputting signals that increase the gain in the case where the input falls below the lower limit value.

The amplification factor (gain) of the electric signal to be outputted from the sensor cell varies according to the potentials of the gain control parts 9-1 and 9-2. Thus, by controlling the sensor-cell output with the above-described circuit as a whole, it is possible to obtain a variable gain photoelectric conversion cell capable of gain adjustment.

With the present invention, variable-gain photoelectric conversion devices, cells, and arrays with high sensitivity and a high dynamic range can be realized through silicon LSI techniques. This allows not only improved performance of general digital cameras but also real-time imaging of high-contrast objects and real-time imaging that involves partial lightening on dark areas. Accordingly, it is possible to realize an observation device that has been requested so far to achieve imaging of high-contrast objects and dark areas with partial lightening in the course of development of scientific technologies, security cameras for safety, and the like at low cost.

A method of varying gain of an amplifying photoelectric conversion device which includes: an amplifying photoelectric conversion part including a photoelectric conversion element and a plurality of transistors each having a collector, a base, and an emitter; and a plurality of first field-effect transistors each having a source, a drain, and a gate, and in which the sources and the drains of the first field-effect transistors are connected respectively between the emitters and the bases of the plurality of transistors, the photoelectric conversion element is connected to the base of a transistor selected from the plurality of transistors, the photoelectric conversion element is a device which performs photoelectric conversion of light input information being light intensity or light wavelength into an electric variable being electric current, electric charge, or voltage, at least one of the collectors of the plurality of transistors is a first output part, one of the emitters of the plurality of transistors is a second output part, the emitters of the plurality of transistors other than the second output part are connected respectively to the bases of the other transistors further excluding the selected transistor, to the base of which the photoelectric conversion element is connected, and the electric variable resulting from the photoelectric conversion is an electric signal in the form of an amplified current, charge, or voltage obtained from the first output part or the second output part, the method includes: the step of applying gain control potentials to the gates to vary gain of the electric signal obtained from the first output part or the second output part.

A variable gain photoelectric conversion device includes: an amplifying photoelectric conversion device including: an amplifying photoelectric conversion part including a photoelectric conversion element and a plurality of transistors each having a collector, a base, and an emitter; and a plurality of first field-effect transistors each having a source, a drain, and a gate, in which the sources and the drains of the first field-effect transistors are connected respectively between the emitters and the bases of the transistors, the photoelectric conversion element is connected to the base of a transistor selected from the plurality of transistors, the photoelectric conversion element is a device which performs photoelectric conversion of light input information being light intensity or light wavelength into an electric variable being electric current, electric charge, or voltage, at least one of the collectors of the plurality of transistors is a first output part, one of the emitters of the plurality of transistors is a second output part, the emitters of the plurality of transistors other than the second output part are connected respectively to the bases of the other transistors further excluding the selected transistor, to the base of which the photoelectric conversion element is connected, and the electric variable resulting from the photoelectric conversion is an electric signal in the form of an amplified current, charge, or voltage obtained from the first output part or the second output part, in which gain control potentials are applied to the gates to vary gain of the electric signal obtained from the first output part or the second output part.

The photoelectric conversion element is a photodiode.

The photoelectric conversion element is a photodiode including the collector and the base of the selected transistor.

In the amplifying photoelectric conversion device the transistors have different amplification factors, and a gain control potential is applied to a given one or more of the gates to vary the gain of the electric signal obtained from the first output part or the second output part.

In the variable gain photoelectric conversion device, the transistors have different amplification factors, and a gain control potential is applied to a given one or more of the gates to vary the gain of the electric signal obtained from the first output part or the second output part.

A variable gain photoelectric conversion device includes: an amplifying photoelectric conversion part having a plurality of bases provided respectively for collectors continuous with or connected to each other and a plurality of emitters provided respectively for the plurality of bases; and a plurality of first field-effect transistors each having a source, a drain, and a gate, in which the collectors are a first output part, one of the plurality of emitters is a second output part, one of the plurality of bases and the collectors perform photoelectric conversion of light input information being light intensity or light wavelength into an electric variable being electric current, electric charge, or voltage, the plurality of bases other than the base involved in the photoelectric conversion are respectively connected to the plurality of emitters other than the emitter serving as the second output, the electric variable resulting from the photoelectric conversion is an electric signal in the form of an amplified current, charge, or voltage obtained from the first output part or the second output part, either of the sources and the drains are connected to either of the bases and the emitters, respectively, the other of the sources and the drains are connected to the other of the bases and the emitters, respectively, and gain control potentials are applied to the gates to vary gain of the electric signal obtained from the first output part or the second output part.

A variable gain photoelectric conversion cell, includes: the variable gain photoelectric conversion device; and a second field-effect transistor having a source, a drain, and a gate, in addition to the first field-effect transistors, in which the second output part is connected to one of the source and the drain of the second field-effect transistor, the other of the source and the drain of the second field-effect transistor is a cell output part, the gate of the second field-effect transistor is a cell select part, and the variable gain photoelectric conversion cell is selected by shifting a potential applied to the cell select part from a first select potential at which the second field-effect transistor is shut off to a second select potential at which the second field-effect transistor is conductive.

A variable gain photoelectric conversion cell includes: the variable gain photoelectric conversion device, in which gain adjustment is performed by monitoring the electric signal outputted from the first output part or the second output part and by controlling voltages to be applied to the gates on the basis of a result of the monitoring.

The gain adjustment is performed by monitoring the electric signal outputted from the first output part or the second output part and by controlling voltages to be applied to the gates on the basis of a result of the monitoring.

The gain adjustment is performed by comparing the electric signal outputted from the first output part or the second output part with a reference electric signal, converting a difference therebetween into a digital signal, and supplying gain control potentials at levels which eliminate the difference.

The gain adjustment is performed by inputting the electric signal outputted from the first output part or the second output part into a plurality of comparators and supplying outputs of the comparators to the gates as gain control potentials.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A method of varying gain of an amplifying photoelectric conversion device which includes: an amplifying photoelectric conversion part including a photoelectric conversion element and a plurality of transistors each having a collector, a base, and an emitter; and a plurality of first field-effect transistors each having a source, a drain, and a gate, and in which
    the sources and the drains of the first field-effect transistors are connected respectively between the emitters and the bases of the plurality of transistors,
    the photoelectric conversion element is connected to the base of a transistor selected from the plurality of transistors,
    the photoelectric conversion element is a device which performs photoelectric conversion of light input information being light intensity or light wavelength into an electric variable being electric current, electric charge, or voltage,
    at least one of the collectors of the plurality of transistors is a first output part,
    one of the emitters of the plurality of transistors is a second output part,
    the emitters of the plurality of transistors other than the second output part are connected respectively to the bases of the other transistors further excluding the selected transistor, to the base of which the photoelectric conversion element is connected, and
    the electric variable resulting from the photoelectric conversion is an electric signal in the form of an amplified current, charge, or voltage obtained from the first output part or the second output part,
    the method comprising: the step of applying gain control potentials to the gates to vary gain of the electric signal obtained from the first output part or the second output part.

2. A variable gain photoelectric conversion device comprising:
    an amplifying photoelectric conversion device including: an amplifying photoelectric conversion part including a photoelectric conversion element and a plurality of transistors each having a collector, a base, and an emitter; and a plurality of first field-effect transistors each having a source, a drain, and a gate, in which the sources and the drains of the first field-effect transistors are connected respectively between the emitters and the bases of the transistors, the photoelectric conversion element is connected to the base of a transistor selected from the plurality of transistors, the photoelectric conversion element is a device which performs photoelectric conversion of light input information being light intensity or light wavelength into an electric variable being electric current, electric charge, or voltage, at least one of the collectors of the plurality of transistors is a first output part, one of the emitters of the plurality of transistors is a second output part, the emitters of the plurality of transistors other than the second output part are connected respectively to the bases of the other transistors further excluding the selected transistor, to the base of which the photoelectric conversion element is connected, and the electric variable resulting from the photoelectric conversion is an electric signal in the form of an amplified current, charge, or voltage obtained from the first output part or the second output part, wherein
    gain control potentials are applied to the gates to vary gain of the electric signal obtained from the first output part or the second output part.

3. The variable gain photoelectric conversion device according to claim 2, wherein the photoelectric conversion element is a photodiode.

4. The variable gain photoelectric conversion device according to claim 2, wherein the photoelectric conversion element is a photodiode including the collector and the base of the selected transistor.

5. The method of varying gain according to claim 1, wherein
    in the amplifying photoelectric conversion device according to claim 1 the transistors have different amplification factors, and
    a gain control potential is applied to a given one or more of the gates to vary the gain of the electric signal obtained from the first output part or the second output part.

6. The variable gain photoelectric conversion device according to claim 2, wherein
    in the variable gain photoelectric conversion device, the transistors have different amplification factors, and
    a gain control potential is applied to a given one or more of the gates to vary the gain of the electric signal obtained from the first output part or the second output part.

7. A variable gain photoelectric conversion device comprising:
    an amplifying photoelectric conversion part having a plurality of bases provided respectively for collectors continuous with or connected to each other and a plurality of emitters provided respectively for the plurality of bases; and
    a plurality of first field-effect transistors each having a source, a drain, and a gate, wherein
    the collectors are a first output part,
    one of the plurality of emitters is a second output part,
    one of the plurality of bases and the collectors perform photoelectric conversion of light input information being light intensity or light wavelength into an electric variable being electric current, electric charge, or voltage,
    the plurality of bases other than the base involved in the photoelectric conversion are respectively connected to the plurality of emitters other than the emitter serving as the second output,
    the electric variable resulting from the photoelectric conversion is an electric signal in the form of an amplified current, charge, or voltage obtained from the first output part or the second output part,
    either of the sources and the drains are connected to either of the bases and the emitters, respectively,
    the other of the sources and the drains are connected to the other of the bases and the emitters, respectively, and
    gain control potentials are applied to the gates to vary gain of the electric signal obtained from the first output part or the second output part.

8. A variable gain photoelectric conversion cell, comprising:
   the variable gain photoelectric conversion device according to claim 2; and
   a second field-effect transistor having a source, a drain, and a gate, in addition to the first field-effect transistors, wherein
   the second output part is connected to one of the source and the drain of the second field-effect transistor,
   the other of the source and the drain of the second field-effect transistor is a cell output part,
   the gate of the second field-effect transistor is a cell select part, and
   the variable gain photoelectric conversion cell is selected by shifting a potential applied to the cell select part from a first select potential at which the second field-effect transistor is shut off to a second select potential at which the second field-effect transistor is conductive.

9. A variable gain photoelectric conversion cell comprising:
   the variable gain photoelectric conversion device according to claim 2, wherein gain adjustment is performed by monitoring the electric signal outputted from the first output part or the second output part and by controlling voltages to be applied to the gates on the basis of a result of the monitoring.

10. The variable gain photoelectric conversion cell according to claim 8, wherein gain adjustment is performed by monitoring the electric signal outputted from the first output part or the second output part and by controlling voltages to be applied to the gates on the basis of a result of the monitoring.

11. The variable gain photoelectric conversion cell according to claim 9, wherein the gain adjustment is performed by comparing the electric signal outputted from the first output part or the second output part with a reference electric signal, converting a difference therebetween into a digital signal, and supplying gain control potentials at levels which eliminate the difference.

12. The variable gain photoelectric conversion cell according to claim 10, wherein the gain adjustment is performed by comparing the electric signal outputted from the first output part or the second output part with a reference electric signal, converting a difference therebetween into a digital signal, and supplying gain control potentials at levels which eliminate the difference.

13. The variable gain photoelectric conversion cell according to claim 9, wherein the gain adjustment is performed by inputting the electric signal outputted from the first output part or the second output part into a plurality of comparators and supplying outputs of the comparators to the gates as gain control potentials.

14. The variable gain photoelectric conversion cell according to claim 10, wherein the gain adjustment is performed by inputting the electric signal outputted from the first output part or the second output part into a plurality of comparators and supplying outputs of the comparators to the gates as gain control potentials.

* * * * *